(12) United States Patent
Kaito

(10) Patent No.: US 7,419,697 B2
(45) Date of Patent: Sep. 2, 2008

(54) METHOD FOR MANUFACTURING PHOTOCONDUCTIVE LAYER CONSTITUTING RADIATION IMAGING PANEL

(75) Inventor: Ryouzou Kaito, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 524 days.

(21) Appl. No.: 11/087,646

(22) Filed: Mar. 24, 2005

(65) Prior Publication Data

US 2005/0214446 A1    Sep. 29, 2005

(30) Foreign Application Priority Data

Mar. 24, 2004 (JP) ............................. 2004-086144
Mar. 24, 2004 (JP) ............................. 2004-086145

(51) Int. Cl.
*B05D 5/12* (2006.01)

(52) U.S. Cl. .................... 427/65; 427/160; 427/201; 427/205; 427/226

(58) Field of Classification Search .................. 427/65, 427/160, 157, 201, 205, 226
See application file for complete search history.

(56) References Cited

U.S. PATENT DOCUMENTS

2006/0065880 A1* 3/2006 Tanaka et al. ............... 252/500
2006/0204423 A1* 9/2006 Nakamura ................. 423/326

FOREIGN PATENT DOCUMENTS

JP          11-237478 A     8/1999
JP          2000-249769 A   9/2000

* cited by examiner

*Primary Examiner*—Frederick J Parker
(74) *Attorney, Agent, or Firm*—Sughrue Mion, PLLC

(57) ABSTRACT

Bismuth salt and metal alkoxide are reacted with each other under an acidic condition, and a $Bi_{12}MO_{20}$ precursor solution (where M is at least one of Ge, Si and Ti) is obtained. The obtained $Bi_{12}MO_{20}$ precursor solution is concentrated to be formed into gel, and the gel $Bi_{12}MO_{20}$ precursor is fired to be formed into powder. The powder is mixed with a binder and coated on a support, and so on. In such a way, a photoconductive layer, which is formed of a bismuth oxide-series complex oxide with a high collection effect of charges generated and small electric noise, is manufactured.

3 Claims, 5 Drawing Sheets

METHOD FOR MANUFACTURING PHOTOCONDUCTIVE LAYER CONSTITUTING RADIATION IMAGING PANEL

BACKGROUND OF THE INVENTION

1. Field of the Invention

The present invention relates to a radiation imaging panel suitable for application to a radiation imaging apparatus using an X-ray and the like, and specifically to a method for manufacturing a photoconductive layer constituting the radiation imaging panel.

2. Description of the Related Art

Heretofore, in medical X-ray imaging, an X-ray imaging panel has been known, which uses a photoconductive layer sensitive to an X-ray as a photosensitive member for the purpose of reducing a dose of radiation exposed to a subject, improving diagnostic performance, and so on, reads an electrostatic latent image formed on the photoconductive layer by the X-ray by means of light or a large number of electrodes, and records the image thus read. A method using the X-ray imaging panel is superior in that resolution thereof is higher than fluorography by a television camera tube, which is a well-known imaging method.

The above-described X-ray imaging panel is constituted to generate charges corresponding to X-ray energy by irradiating a charge generation layer provided therein with the X-ray, and to read the generated charges as electric signals. The above-described photoconductive layer acts as the charge generation layer. Heretofore, amorphous selenium has been used for the photoconductive layer. However, X-ray absorptivity of amorphous selenium is low in general. Accordingly, it is necessary that the thickness of the photoconductive layer be formed thick (for example, 500 μm or more).

However, when such film thickness is thickened, reading speed of the latent image decreases. In addition, high voltage is applied to the photoconductive layer at least during a period from a start of the reading to an end thereof after the latent image is formed. Accordingly, dark current increases, and charges caused by the dark current are added to the charges of the latent image, which thereby decrease a contrast in a low-dose range. These are regarded as problems. Moreover, the high voltage is applied to the photoconductive layer, and accordingly, device deterioration is prone to occur, durability thereof is prone to decrease, and electric noise is prone to occur. Furthermore, the photoconductive layer is usually formed by an evaporation method, and accordingly, it takes a considerable time to grow the photoconductive layer until the photoconductive layer reaches the thickness as described above, and management of such a growth process is also cumbersome. These factors eventually lead to an increase in manufacturing cost of the photoconductive layer, which bring about an increase in cost of the X-ray imaging panel.

Considering the problems as described above, materials for the photoconductive layer other than the selenium are being studied. For example, in Japanese Unexamined Patent Publication Nos. 11 (1999)-237478 and 2000-249769, as a material constituting the photoconductive layer, a bismuth oxide-series complex oxides represented by a composition formula $Bi_xMO_y$ (where M is at least one of Ge, Si and Ti, x is the number satisfying a condition $10 \leq x \leq 14$, and y represents the stoichiometric atomic number of oxygen according to M and x which are described above) is described. In accordance with the bismuth oxide-series complex oxides, it can be expected that charge conversion efficiency of the X-ray will be improved.

In general, with regard to $Bi_{12}MO_{20}$ synthesized by a solid phase method which fires $Bi_2O_3$ and $MO_3$ at 800° C., there is a problem that a collection effect of the generated charges is poor because a particle diameter thereof becomes as large as a size in a micron order and a filling density of the formed photoconductive layer is low. Incidentally, in the above-described Japanese Unexamined Patent Publication Nos. 11 (1999)-237478 and 2000-249769, the following is described as a method for forming the photoconductive layer. Specifically, sol or gel obtained by performing hydrolysis for alkoxides of the bismuth and the metal is subjected to a sintering treatment, and the sol or gel thus sintered is dispersed and coated, thereby forming the photoconductive layer (hereinafter, this method is referred to as a sol-gel method).

Moreover, in the above-described Japanese Unexamined Patent Publication Nos. 11 (1999)-237478 and 2000-249769, the sol or gel obtained by performing the hydrolysis is subjected to the sintering treatment, and rapid crystal growth occurs owing to the sintering treatment. Accordingly, the size of generated particles becomes large, and therefore, the filling density of the photoconductive layer cannot be raised to a satisfactory level. Moreover, the above-described Japanese Unexamined Patent Publication Nos. 11 (1999)-237478 and 2000-249769 only describe that the alkoxides of the bismuth and the metal are subjected to the hydrolysis, and specific liquid characteristics thereof and the like are unknown. In addition, if only the alkoxides are reacted with each other in a liquid phase, the alkoxides become amorphous particles without being crystallized. However, if the amorphous particles are left as they are, electron mobility thereof is low, and the amorphous particles have so many traps that electrons are captured thereby quickly, and accordingly, photoconductivity thereof is deteriorated.

SUMMARY OF THE INVENTION

The present invention has been made in consideration of the circumstances as described above. It is an object of the present invention to provide a novel method for manufacturing a photoconductive layer formed of a bismuth oxide-series complex oxide.

A first method according to the present invention for manufacturing a photoconductive layer constituting a radiation imaging panel is characterized in that bismuth salt and metal alkoxide are reacted with each other under an acidic condition to obtain a $Bi_{12}MO_{20}$ precursor solution (where M is at least one of Ge, Si and Ti, and hereinafter, this description will be omitted), the obtained $Bi_{12}MO_{20}$ precursor solution is concentrated to be formed into gel, the gel $Bi_{12}MO_{20}$ precursor is fired to be formed into powder, and the photoconductive layer is manufactured by using the powder.

It is preferable that the bismuth salt be bismuth nitrate or bismuth acetate.

A second method according to the present invention for manufacturing a photoconductive layer constituting a radiation imaging panel is characterized in that respective alkoxides of bismuth and metal are subjected to hydrolysis under an alkaline condition to obtain a $Bi_{12}MO_{20}$ precursor solution (where M is at least one of Ge, Si and Ti), the obtained $Bi_{12}MO_{20}$ precursor solution is crystallized in a liquid phase to be formed into powder, and the photoconductive layer is manufactured by using the powder.

In the first method according to the present invention for manufacturing a photoconductive layer constituting a radiation imaging panel, the bismuth salt and the metal alkoxide are reacted with each other under the acidic condition to obtain the $Bi_{12}MO_{20}$ precursor solution, the obtained $Bi_{12}MO_{20}$ precursor solution is concentrated to be formed into gel, the gel $Bi_{12}MO_{20}$ precursor is fired to be formed into powder, and the photoconductive layer is manufactured by using the powder. Accordingly, in comparison with the case of manufacturing the photoconductive layer by a conventional solid phase method, a particle diameter of the obtained powder can be reduced to a size in a submicron order, thus making it possible to increase a filling factor of $Bi_{12}MO_{20}$ in the photoconductive layer. Therefore, a collection effect of generated charges is enhanced, and electric noise decreases. Therefore, it becomes possible to improve image granularity.

Moreover, in comparison with the case of manufacturing the photoconductive layer by a conventional sol-gel method, it becomes possible to restrict manufacturing cost thereof because the bismuth salt is used as a source of the bismuth. In addition, when the bismuth salt and the metal alkoxide are reacted with each other under the acidic condition, it is possible to easily control a concentration of bismuth ions in the reaction solution by a concentration of the bismuth salt. Accordingly, it is satisfactory if attention is paid only to a hydrolysis rate of the metal alkoxide, and a simple synthesis can be realized.

In the second method according to the present invention for manufacturing a photoconductive layer constituting a radiation imaging panel, the respective alkoxides of the bismuth and the metal are subjected to the hydrolysis under the alkaline condition to obtain the $Bi_{12}MO_{20}$ precursor solution, the obtained $Bi_{12}MO_{20}$ precursor solution is crystallized in the liquid phase to be formed into powder, and the photoconductive layer is manufactured by using the powder. Accordingly, in comparison with the case of manufacturing the photoconductive layer by the conventional solid phase method, a particle diameter of the obtained powder can be reduced to the size in the submicron order, thus making it possible to increase the filling factor of $Bi_{12}MO_{20}$ in the photoconductive layer. Therefore, the collection effect of the generated charges is enhanced, and the electric noise decreases. Therefore, it becomes possible to improve the image granularity.

In particular, liquid characteristics at the time of the reaction are made alkaline, and thus, micro amorphous $Bi_{12}MO_{20}$ particles can be deposited in the liquid phase, and further, can be crystallized by being heated as they are. Accordingly, it becomes possible to manufacture $Bi_{12}MO_{20}$ crystal particles with a small diameter without causing the rapid crystal growth.

DESCRIPTION OF THE PREFERRED EMBODIMENT

Figure 1:
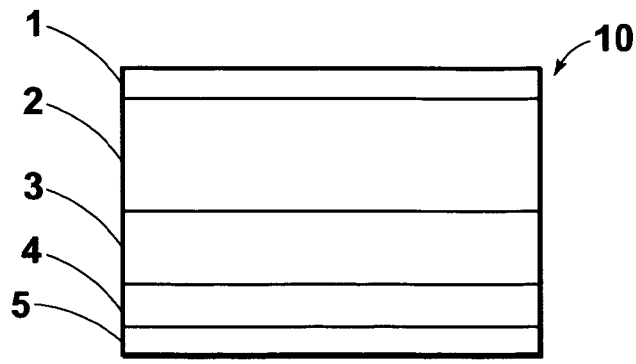
FIG. 1 is a cross-sectional view showing an embodiment of a radiation imaging panel including a photoconductive layer manufactured by a manufacturing method of the present invention.

A first method according to the present invention for manufacturing a photoconductive layer constituting a radiation imaging panel is characterized in that bismuth salt and metal alkoxide are reacted with each other under an acidic condition to obtain a $Bi_{12}MO_2$ precursor solution, the obtained $Bi_{12}MO_{20}$ precursor solution is concentrated to be formed into gel, the gel $Bi_{12}MO_{20}$ precursor is fired to be formed into powder, and by use of the powder, the photoconductive layer of the radiation imaging panel is manufactured.

It is preferable that the bismuth salt be bismuth nitrate or bismuth acetate. As the metal alkoxide, preferably mentioned can be: alkoxides of Ge, Si and Ti; and more specifically, $Ge(O-CH_3)_4$; $Ge(O-C_2H_5)_4$; $Ge(O-iC_3H_7)_4$; $Si(O-CH_3)_4$; $Si(O-C_2H_5)_4$; $Si(O-iC_3H_7)_4$; $Ti(O-CH_3)_4$; $Ti(O-C_2H_5)_4$; $Ti(O-iC_3H_7)_4$; and the like.

With regard to a method for reacting the bismuth salt and the metal alkoxide with each other under the acidic condition, the reaction can be performed by any known method as appropriate. For example, it is preferable that the bismuth salt and the metal alkoxide be subjected to hydrolysis together with a mixed solution of methoxyethanol and nitric acid, a mixed solution of ethoxyethanol and nitric acid, and the like.

As a specific method for manufacturing the photoconductive layer by use of the powder, in which the gel $Bi_{12}MO_{20}$ precursor is fired to be formed into the powder, for example, known methods such as: a binder coating method, in which the powder is mixed with a binder, coated on a support, and dried after being coated; an aerosol deposition method, in which the $Bi_{12}MO_{20}$ powder is raised in vacuum by carrier gas, the carrier gas mixed with the $Bi_{12}MO_{20}$ powder is injected onto a support, and the $Bi_{12}MO_{20}$ powder is thus deposited thereon; a press sintering method, in which the $Bi_{12}MO_{20}$ powder is pressed with high pressure by use of a pressing machine to be formed into a film, and the film thus obtained is sintered; a method (hereinafter, referred to as a green sheet method) for performing binder elimination and sintering of the powder, in which the $Bi_{12}MO_{20}$ powder is coated by use of a binder to fabricate a green sheet (film containing the binder), and the green sheet (film containing the binder) is fired; and the like are employable.

As the binder for use in the above-described binder coating method, nitrocellulose, ethyl cellulose, cellulose acetate, vinylidene chloride/vinyl chloride copolymer, polyalkyl methacrylate, polyurethane, polyvinyl butyral, polyester, polystyrene, polyamide, polyethylene, polyvinyl chloride, polyvinyl acetate, vinyl chloride/vinyl acetate copolymer, cellulose acetate, polyvinyl alcohol, linear polyester, and the like are preferred. Moreover, as the binder for use in the green sheet method, cellulose acetate, polyalkyl methacrylate, polyvinyl alcohol, polyvinyl butyral, and the like are preferred.

As in the first manufacturing method of the present invention, for the coating method, one is used, which is obtained in a manner that the bismuth salt and the metal alkoxide are reacted with each other under the acidic condition to obtain the $Bi_{12}MO_{20}$ precursor solution, the obtained $Bi_{12}MO_{20}$ precursor solution is concentrated to be formed into the gel, the gel $Bi_{12}MO_{20}$ precursor is fired to be formed into the powder. In this case, in comparison with the case of manufacturing the photoconductive layer by a conventional solid phase method (which fires $Bi_2O_3$ and $Mo_3$ at 800° C.), a particle diameter of the obtained powder can be reduced to a size in a submicron order, thus making it possible to increase a filling factor of $Bi_{12}MO_{20}$ in the photoconductive layer. Accordingly, a collection effect of generated charges is enhanced, and electric noise decreases. Therefore, it becomes possible to improve image granularity.

Moreover, in comparison with the case of manufacturing the photoconductive layer by the conventional sol-gel method, it becomes possible to restrict manufacturing cost thereof because the bismuth salt is used as a source of the bismuth. In addition, when the bismuth salt and the metal alkoxide are reacted with each other under the acidic condition, it is possible to easily control the concentration of bismuth ions in the reaction solution by the concentration of the bismuth salt. Accordingly, it is satisfactory if attention is paid only to a hydrolysis rate of the metal alkoxide, and a simple synthesis can be realized.

A second method according to the present invention for manufacturing a photoconductive layer constituting a radiation imaging panel is characterized in that respective alkoxides of bismuth and metal are subjected to hydrolysis under an alkaline condition to obtain a $Bi_{12}MO_{20}$ precursor solution (where M is at least one of Ge, Si and Ti, and hereinafter, this description is omitted), the obtained $Bi_{12}MO_{20}$ precursor solution is crystallized in a liquid phase to be formed into powder, and the photoconductive layer is manufactured by using the powder.

As the alkoxide of the bismuth, $Bi(O—CH_3)_3$, $Bi(O—C_2H_5)_3$, $Bi(—iC_3H_7)_3$ and the like can be preferably mentioned. As the metal alkoxide, preferably mentioned can be: alkoxides of Ge, Si and Ti; and more specifically, $Ge(O—CH_3)_4$; $Ge(O—C_2H_5)_4$; $Ge(O—iC_3H_7)_4$; $Si(O—CH_3)_4$; $Si(O—C_2H_5)_4$; $Si(O—iC_3H_7)_4$; $Ti(O—CH_3)_4$; $Ti(O—C_2H_5)_4$; $Ti(O—iC_3H_7)_4$; and the like.

With regard to a method for performing the hydrolysis for the alkoxide of the bismuth and the metal alkoxide under the alkaline solution, the hydrolysis can be performed by any known method as appropriate. For example, preferably, the alkoxide of the bismuth and the metal alkoxide are subjected to the hydrolysis together with sodium hydroxide, potassium hydroxide and the like.

As a specific method for manufacturing the photoconductive layer by use of the $Bi_{12}MO_{20}$ powder, for example, usable are known methods such as: a binder coating method, in which the powder is mixed with a binder, coated on a support, and dried after being coated; an aerosol deposition method, in which the $Bi_{12}MO_{20}$ powder is raised in vacuum by carrier gas, the carrier gas mixed with the $Bi_{12}MO_{20}$ powder is injected onto a support, and the $Bi_{12}MO_{20}$ powder is thus deposited thereon; a press sintering method, in which the $Bi_{12}MO_{20}$ powder is pressed with high pressure by use of a pressing machine to be formed into a film, and the film thus obtained is sintered; a method (hereinafter, referred to as a green sheet method) for performing binder elimination and sintering of the powder, in which the $Bi_{12}MO_{20}$ powder is coated by use of a binder to fabricate a green sheet (film containing the binder), and the green sheet (film containing the binder) is fired; and the like.

As the binder for use in the above-described binder coating method, nitrocellulose, ethyl cellulose, cellulose acetate, vinylidene chloride/vinyl chloride copolymer, polyalkyl methacrylate, polyurethane, polyvinyl butyral, polyester, polystyrene, polyamide, polyethylene, polyvinyl chloride, polyvinyl acetate, vinyl chloride/vinyl acetate copolymer, cellulose acetate, polyvinyl alcohol, linear polyester, and the like are preferable. Moreover, as the binder for use in the green sheet method, cellulose acetate, polyalkyl methacrylate, polyvinyl alcohol, polyvinyl butyral, and the like are preferable.

As in the second manufacturing method of the present invention, for the coating method, one is used, which is obtained in a manner that the respective alkoxides of the bismuth and the metal are subjected to the hydrolysis under the alkaline condition to obtain the $Bi_{12}MO_{20}$ precursor solution, the obtained $Bi_{12}MO_{20}$ precursor solution is crystallized in the liquid phase to be formed into the powder. In this case, in comparison with the case of manufacturing the photoconductive layer by the conventional solid phase method (which fires $Bi_2O_3$ and $MO_3$ at 800° C.), a particle diameter of the obtained powder can be reduced to the size in the submicron order, thus making it possible to increase the filling factor of $Bi_{12}MO_{20}$ in the photoconductive layer. Accordingly, the collection effect of the generated charges is enhanced, and the electric noise decreases. Therefore, it becomes possible to improve the image granularity.

Moreover, in the conventional sol-gel method, liquid characteristics are unknown, in which the reaction is to be performed to obtain micro $Bi_{12}MO_{20}$ particles. In addition, rapid crystal growth occurs owing to the sintering treatment, and accordingly, a size of generated $Bi_{12}MO_{20}$ particles becomes large, and therefore, a photoconductive layer having a satisfactory filling density cannot be obtained. However, in the manufacturing method of the present invention, the powder can be crystallized in the liquid phase (at 130° C.), and accordingly, the rapid crystal growth is difficult to occur in comparison with the sintering treatment, thus making it possible to manufacture $Bi_{12}MO_{20}$ crystal particles with a small particle diameter.

In the radiation imaging panel, there are one according to a direct conversion system which directly converts a radiation into charges and accumulates the charges converted, and one according to an indirect conversion system which converts the radiation once into light by a scintillator of CsI and the like, then converts the light into charges by an a—Si photodiode, and accumulates the charges thus converted. The photoconductive layer manufactured by the manufacturing method of the present invention is one used for the former radiation imaging panel according to the direct conversion system. Note that, besides the X-ray, a γ-ray, an α-ray and the like are usable as the radiation.

Moreover, the photoconductive layer manufactured by the manufacturing method of the present invention can be used for a so-called optical reading system which reads a radiation image by a radiation image detection unit utilizing a semiconductor material which generates charges by being irradiated with light. Furthermore, the photoconductive layer can be used for a system (hereinafter, referred to as a TFT system) which accumulates charges generated by irradiation of the radiation and reads the accumulated charges by switching on/off electrical switches for each pixel such as thin film transistors (TFTs).

First, as an example, a radiation imaging panel for use in the former optical reading system will be described. FIG. 1 is a cross-sectional view showing an embodiment of the radiation imaging panel including the photoconductive layer manufactured by the manufacturing method of the present invention.

The radiation imaging panel 10 is one formed by stacking, in the following order, a first conductive layer 1 which is transparent with respect to a recording radiation L1 to be described later, a recording radiation-conductive layer 2 which exhibits conductivity by receiving irradiation of the radiation L1 having transmitted through the conductive layer 1, a charge transportation layer 3 which acts as a substantial insulator to charges (charges of a latent image polarity; for example, negative charges) charged in the conductive layer 1 and acts as a substantial conductor to charges (charges of a polarity in transportation; positive charges in the above-described example) reverse in polarity to the above-described charges, a reading photoconductive layer 4 which exhibits conductivity by receiving irradiation of reading light L2 to be described later, and a second conductive layer 5 which is transparent with respect to the reading light L2.

Here, as the conductive layers 1 and 5, for example, one (NESA film or the like) in which a conductive substance is evenly coated on a transparent glass plate is suitable. In the charge transportation layer 3, a larger difference between mobility of the negative charges charged in the conductive layer 1 and mobility of the positive charges reverse thereto in polarity is preferable. As the charge transportation layer 3, suitable is an organic compound such as poly(N-vinylcarbazol) (PVK), N,N'-diphenyl-N,N'-bis (3-methylphenyl)-[1,1'-biphenyl]-4, 4'-diamine (TPD) and discotic liquid crystal, a polymer (polycarbonate, polystyrene or PVK) dispersion, a semiconductor substance such as a—Se doped with Cl of 10 to 200 ppm, or the like. In particular, the organic compound (PVK, TPD, discotic liquid crystal or the like) is preferable because the organic compound has photo-insensitivity. Moreover, a dielectric constant of the organic compound is low in general, and accordingly, capacities of the charge transportation layer 3 and the reading photoconductive layer 4 are reduced, and signal extraction efficiency at the time of reading thereof can be increased.

For the reading photoconductive layer 4, suitable is a photoconductive substance containing, as a main component, at least one of a—Se, Se—Te, Se—As—Te, metal-free phthalocyanine, metal phthalocyanine, MgPc (magnesium phthalocyanine), VoPc (phase II of vanadyl phthalocyanine), CuPc (copper phthalocyanine) and the like.

For the recording radiation-conductive layer 2, the photoconductive layer formed of the $Bi_{12}MO_{20}$ sintered body manufactured by the manufacturing method of the present invention is used. Specifically, the photoconductive layer manufactured by the manufacturing method of the present invention is the recording radiation-conductive layer.

Figure 2:
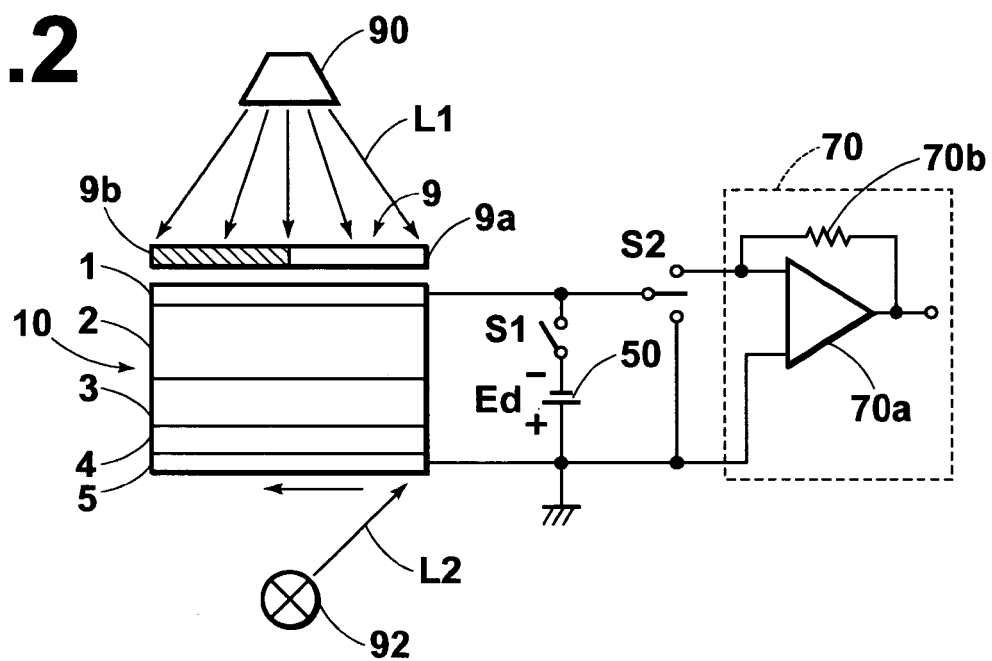
FIG. 2 is a constitutional view schematically showing a recording/reading system using the radiation imaging panel.

Subsequently, a system using light for the purpose of reading an electrostatic latent image will be briefly described. FIG. 2 is a constitutional view schematically showing a recording/reading system (one formed by integrating an electrostatic latent image recording apparatus and an electrostatic latent image reading apparatus) using the radiation imaging panel 10. This recording/reading system is formed of the radiation imaging panel 10, a recording irradiation means 90, a power source 50, current detecting means 70, reading exposure means 92, and connecting means S1 and S2. The electrostatic latent image recording apparatus portion is formed of the radiation imaging panel 10, the power source 50, the recording irradiation means 90, and the connecting means Sl. The electrostatic latent image reading apparatus portion is formed of the radiation imaging panel 10, the current detecting means 70, and the connecting means S2.

The conductive layer 1 of the radiation imaging panel 10 is connected to a negative electrode of the power source 50 through the connecting means Sl, and moreover, is also connected to one end of the connecting means S2. One of the other ends of the connecting means S2 is connected to the current detecting means 70. The conductive layer 5 of the radiation imaging panel 10, a positive electrode of the power source 50 and the other of the other ends of the connecting means S2 are grounded. The current detecting means 70 is formed of a feedback resistor 70b and a detection amplifier 70a composed of an operational amplifier, and constitutes a so-called current/voltage conversion circuit.

An object 9 is placed on an upper surface of the conductive layer 1. The object 9 has a portion 9a which is transparent with respect to the radiation L1 and a shielding portion (light-shielding portion) 9b which does not have transparency. The recording irradiation means 90 evenly exposes and irradiates the object 9 with the radiation L1. The reading exposure means 92 scans and exposes the object 9 with the reading light L2 such as an infrared laser beam and light from an LED and an EL cell in a direction of an arrow in FIG. 3. It is desirable that the reading light L2 have a beam shape converged to a thin diameter.

A process of recording the electrostatic latent image in the recording/reading system constituted as described above will be described below while referring to a charge model (FIG. 3). In FIG. 2, the connecting means S2 is switched to an open state (that is, the connecting means S2 is not connected to either the ground or the current detecting means 70), and the connecting means Sl is switched on to apply direct voltage Ed by the power source 50 between the conductive layer 1 and the conductive layer 5. Then, negative charges are charged from the power source 50 to the conductive layer 1, and positive charges are charged therefrom to the conductive layer 5 (refer to FIG. 3A). In such a way, between the conductive layers 1 and 5 in the radiation imaging panel 10, an electric field in parallel thereto is formed.

Next, the object 9 is evenly exposed and irradiated with the radiation L1 from the recording irradiation means 90. The radiation L1 transmits through the transmitting portion 9a of the object 9, and further transmits through the conductive layer 1. The radiation-conductive layer 2 comes to exhibit the conductivity by receiving the radiation L1 which has thus transmitted. This is understood by the following: the radiation-conductive layer 2 acts as a variable resistor which indicates a variable resistance value in accordance with a dose of the radiation L1. The resistance value depends on the following: charge pairs of electrons (negative charges) and holes (positive charges) are generated by the radiation L1. When the dose of the radiation L1 which has transmitted through the object 9 is small, the radiation-conductive layer 2 indicates a large resistance value (refer to FIG. 3B). Note that the negative charges (−) and the positive charges (+), which are generated by the radiation L1, are shown by circled symbols − and + in the drawing.

The positive charges generated in the radiation-conductive layer 2 move through the radiation-conductive layer 2 toward the conductive layer 1 at high speed, and perform charge recombination with the negative charges charged in the conductive layer 1 on an interface between the conductive layer 1 and the radiation-conductive layer 2. Then, the positive charges disappear (refer to FIGS. 3C and 3D). Meanwhile, the negative charges charged in the radiation-conductive layer 2 move through the radiation-conductive layer 2 toward the charge transportation layer 3. The charge transportation layer 3 acts as the insulator to the same charges (negative charges in this example) in polarity as the charges charged in the conductive layer 1. Accordingly, the negative charges which have moved through the radiation-conductive layer 2 stop on an interface between the radiation-conductive layer 2 and the charge transportation layer 3, and are accumulated on the interface (refer to FIGS. 3C and 3D). A quantity of the accumulated charges is determined by a quantity of the negative charges generated in the radiation-conductive layer 2, that is, by the dose of the radiation L1 which has transmitted through the object 9.

Figure 3A:
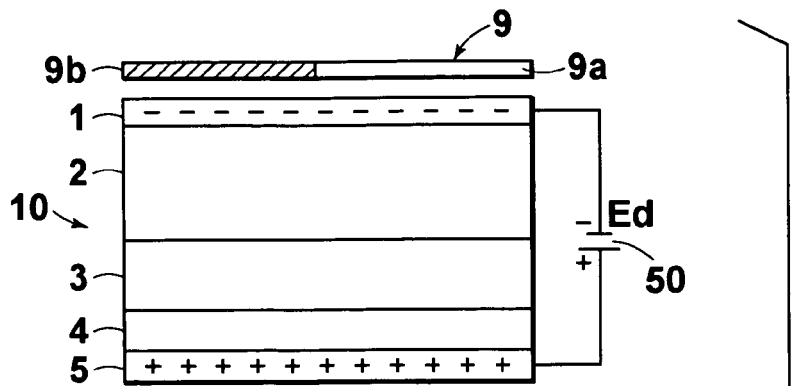
FIGS. 3A to 3D are views showing a process of recording an electrostatic latent image in the recording/reading system based on a charge model.
Figure 3B:
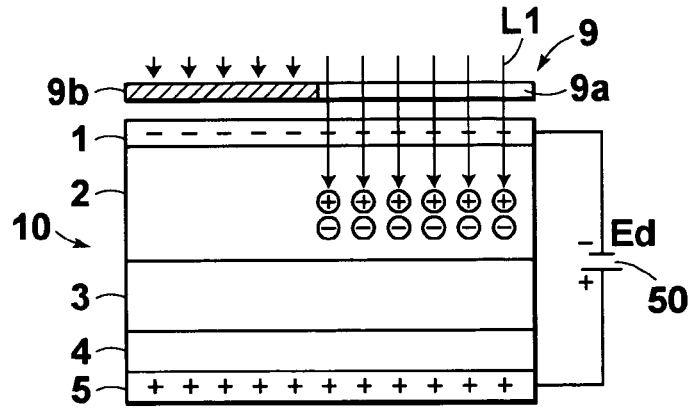
Figure 3C:
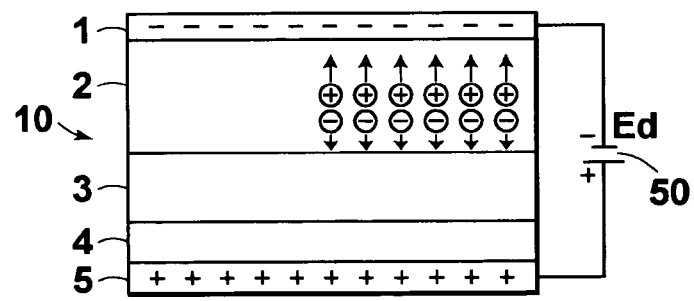
Figure 3D:
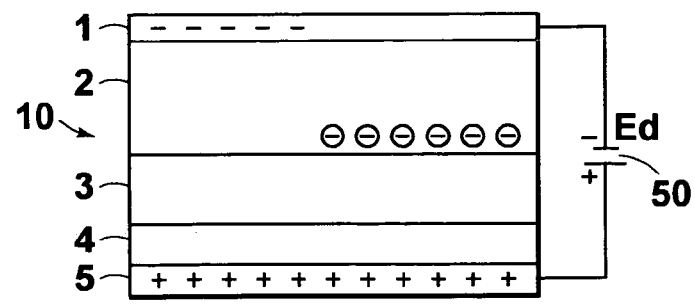

Meanwhile, the radiation L1 does not transmit through the light-shielding portion 9b of the object 9, and accordingly, a portion of the radiation imaging panel 10, which is below the light-shielding portion 9b, does not cause any change (refer to FIGS. 3B to 3D). As described above, the object 9 is exposed and irradiated with the radiation L1, thus making it possible to accumulate charges in accordance with an image of the object in the interface between the radiation-conductive layer 2 and the charge transportation layer 3. Note that the image of the object, which is formed by the charges thus accumulated, is referred to as the electrostatic latent image.

Next, a process of reading the electrostatic latent image will be described while referring to a charge model (FIG. 4). The connecting means S1 is opened to stop a supply of the power source, the connecting means S2 is connected once to the ground side, and the conductive layers 1 and 5 of the radiation imaging panel 10 in which the electrostatic latent image is recorded are charged to the same potential, thereby rearranging the charges (refer to FIG. 4A). Thereafter, the connecting means S2 is connected to the current detecting means 70 side.

When the conductive layer 5 side of the radiation imaging panel 10 is scanned and exposed with the reading light L2 by the reading exposure means 92, the reading light L2 transmits through the conductive layer 5, and the photoconductive layer 4 irradiated with the reading light L2 which has thus transmitted comes to exhibit the conductivity in accordance with the scanning and exposure. This phenomenon depends on the fact that pairs of positive and negative charges are generated by receiving irradiation of the reading light L2 as in the case where the above-described radiation-conductive layer 2 exhibits the conductivity because the pairs of positive and negative charges are generated by receiving the irradiation of the radiation L1 (refer to FIG. 4B). Note that, as in the recording process, the negative charges (−) and the positive charges (+), which are generated by the reading light L2, are shown to circle symbols − and + in the drawing.

Figure 4A:
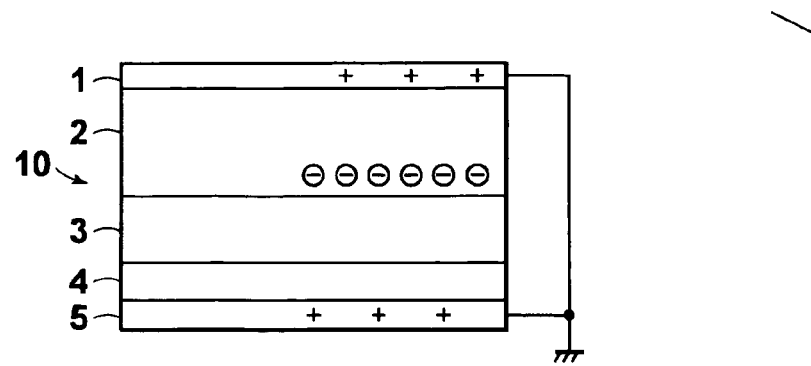
FIGS. 4A to 4D are views showing a process of reading the electrostatic latent image in the recording/reading system based on a charge model.
Figure 4B:
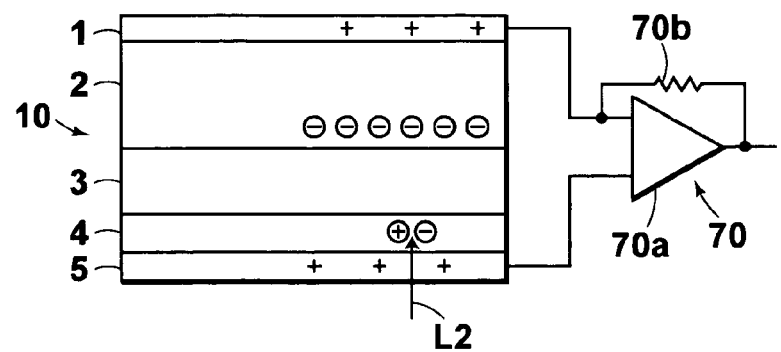
Figure 4C:
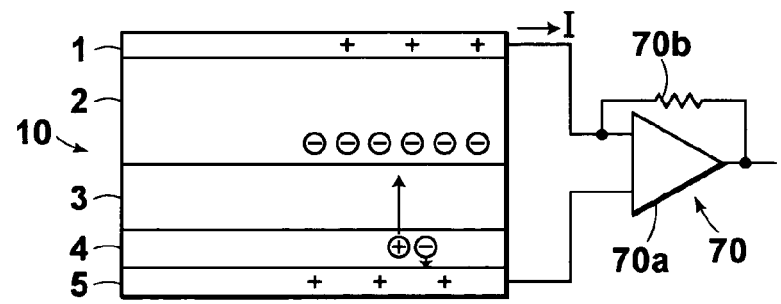
Figure 4D:
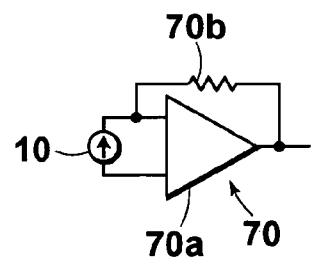

The charge transportation layer 3 acts as the conductor to the positive charges. Accordingly, the positive charges generated in the photoconductive layer 4 move rapidly in a manner of being attracted by the accumulated charges, and perform the charge recombination with the accumulated charges on the interface between the radiation-conductive layer 2 and the charge transportation layer 3. Then, the positive charges disappear (refer to FIG. 4C). Meanwhile, the negative charges generated in the photoconductive layer 4 perform the charge recombination with the positive charges of the conductive layer 5, and then disappear (refer to FIG. 4C). The photoconductive layer 4 is scanned and exposed with a sufficient quantity of light by the reading light L2, and the accumulated charges accumulated on the interface between the radiation-conductive layer 2 and the charge transportation layer 3, that is, the electrostatic latent image is made to entirely disappear by the charge recombination. The above-described fact that the charges accumulated in the radiation imaging panel 10 disappear means that a current I generated by the movement of the charges has flown in the radiation imaging panel 10, and this state can be shown by an equivalent circuit as shown in FIG. 4D, in which the radiation imaging panel 10 is represented by a current source in which a quantity of current depends on a quantity of the accumulated charges.

As described above, the current flowing out of the radiation imaging panel 10 is detected while scanning and exposing the radiation imaging panel 10 concerned with the reading light L2, thus making it possible to sequentially read the quantities of accumulated charges of the respective portions (corresponding to the pixels) scanned and exposed. In such a way, the electrostatic latent image can be read. Note that the above-described operation of detecting the radiation is described in Japanese Unexamined Patent Publication No. 2000-105297 and the like.

Figure 5:
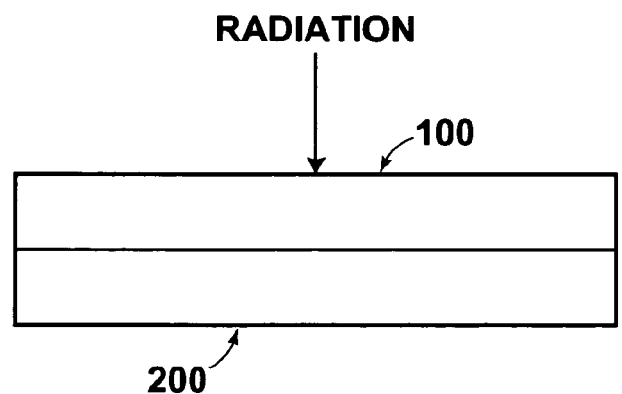
FIG. 5 is a schematic diagram showing a state where a radiation detection unit and an AMA substrate are united together.
Figure 6:
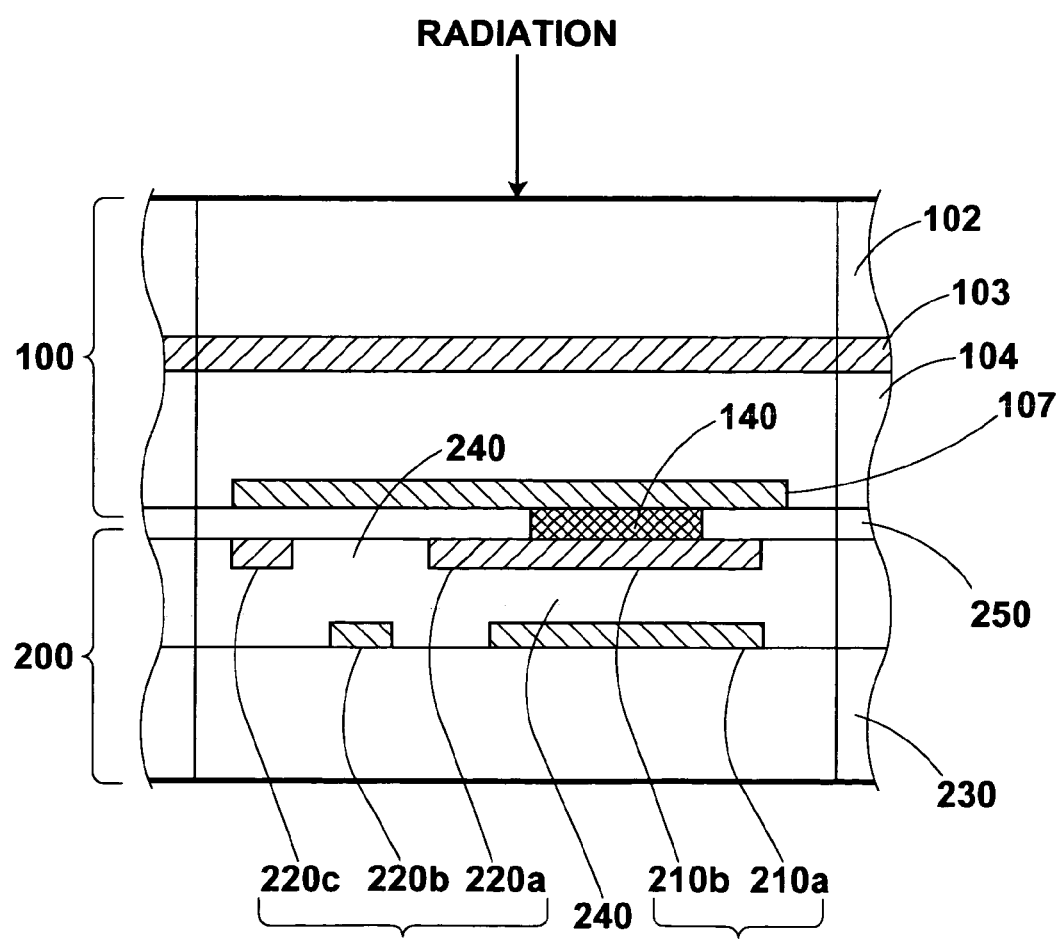
FIG. 6 is a cross-sectional view schematically showing a pixel portion of the radiation detection unit.

Next, a radiation imaging panel in accordance with the latter TFT system will be described. As shown in FIG. 5, the radiation imaging panel has a structure in which a radiation detection unit 100 and an active matrix array substrate (hereinafter, referred to as an AMA substrate) 200 are joined together. As shown in FIG. 6, broadly speaking, the radiation detection unit 100 has a constitution in which a common electrode 103 for applying a bias voltage, a photoconductive layer 104 which generates carriers as pairs of electrons and holes upon sensing the radiation to be detected, and a detection electrode 107 for collecting the carriers, are formed in a stacked manner in order from an incident side of the radiation. A radiation detection unit support 102 may be provided on the common electrode.

The photoconductive layer 104 is manufactured by the manufacturing method of the present invention. For example, each of the common electrode 103 and the detection electrode 107 is formed of a conductive material such as indium tin oxide (ITO), Au and Pt. A hole implantation inhibiting layer and an electron implantation inhibiting layer may be added to the common electrode 103 and the detection electrode 107 in accordance with a polarity of the bias voltage.

Figure 7:
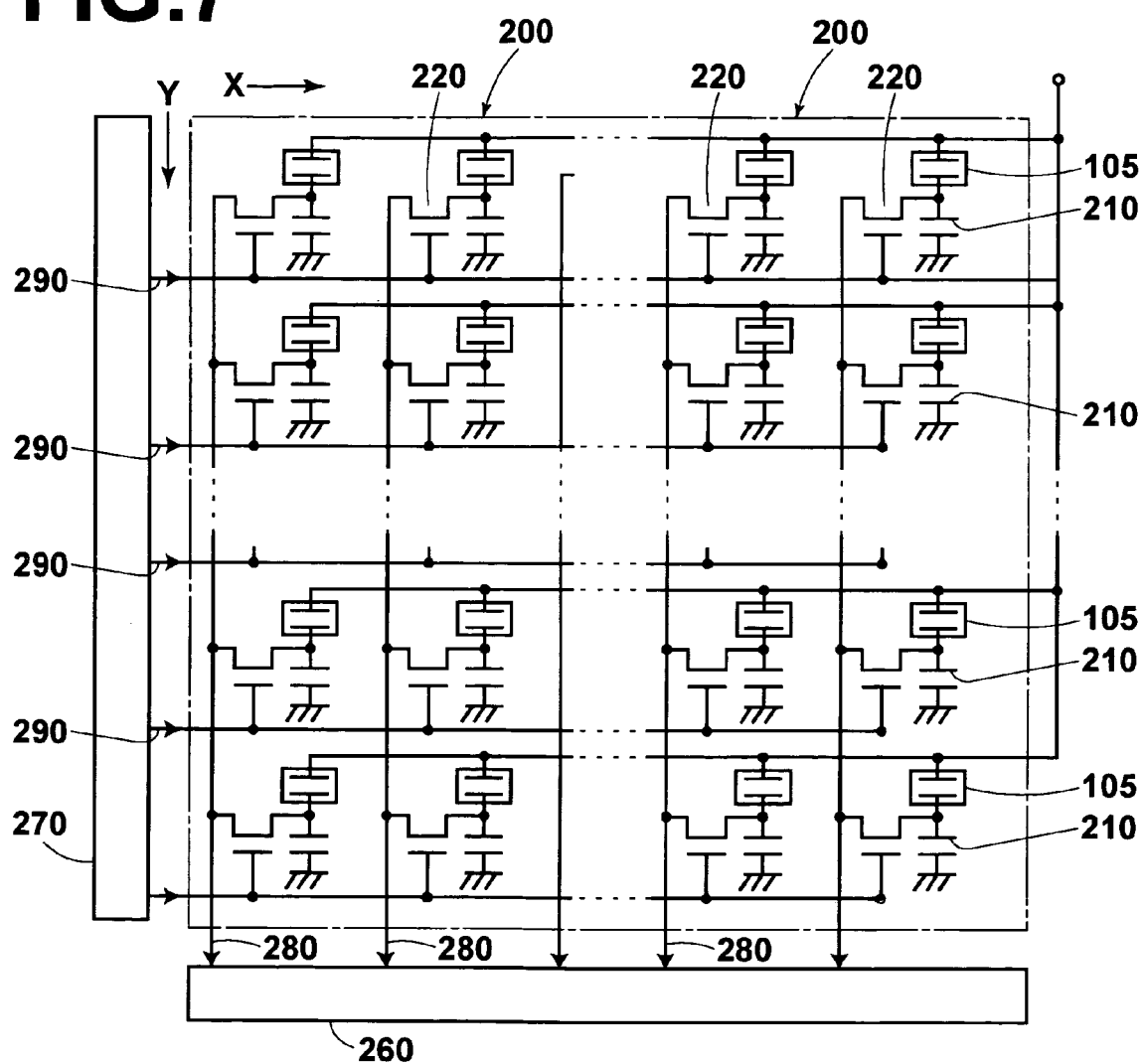
FIG. 7 is an electric circuit diagram showing an equivalent circuit of the AMA substrate.

Constitutions of the respective portions of the AMA substrate 200 will be briefly described. As shown in FIG. 7, in the AMA substrate 200, a capacitor 210 as a charge accumulation capacitor and a TFT 220 as a switching element are provided for each one of radiation detectors 105 corresponding to the pixels. In the support 102, the radiation detectors 105 corresponding to the pixels are two-dimensionally arrayed with a matrix constitution of approximately 1000 to 3000 pieces in the longitudinal direction and approximately 1000 to 3000 pieces in the lateral direction in accordance with the necessary pixels. Moreover, also in the AMA substrate 200, the capacitors 210 and the TFTs 220, which are equal in number to the pixels, are two-dimensionally arrayed with a similar matrix constitution. Charges generated in the photoconductive layer are accumulated in the capacitors 210, and become an electrostatic latent image in accordance with the optical reading system. In the TFT method of the present invention, the electrostatic latent image generated by the radiation is held in the charge accumulation capacitors.

Specific constitutions of the capacitors 210 and the TFTs 220 in the AMA substrate 200 are as shown in FIG. 6. Specifically, an AMA substrate support 230 is an insulator. Moreover, a connection-side electrode 210b of the capacitor 210 and a source electrode 220b and drain electrode 220c of the TFT 220 are formed in a stacked manner above a ground-side electrode 210a of the capacitor 210 and a gate electrode 220a of the TFT 220, the ground-side electrode 210a and the gate electrode 220a being formed on a surface of the AMA substrate support 230, with an insulating film 240 interposed therebetween. In addition, the uppermost surface of the AMA substrate 200 is covered with a protecting insulating film 250. Furthermore, the connection-side electrode 210b and the source electrode 220b are interconnected to be one, and are formed simultaneously. For example, a plasma SiN film is used as the insulating film 240 constituting both of a capacitor insulating film of the capacitor 210 and a gate insulating film of the TFT 220. The AMA substrate 200 described above is manufactured by use of such thin film formation technology and microprocessing technology for use in producing a liquid crystal display substrate.

Subsequently, the joining of the radiation detection unit 100 and the AMA substrate 200 will be described. In a state where the detection electrode 107 and the connection-side electrode 210b of the capacitor 210 are aligned with each other, both of the substrates 100 and 200 are adhered by heating and pressurization to be bonded together while interposing therebetween an anisotropic conductive film (ACF) which contains conductive particles such as silver particles and has conductivity only in a thickness direction thereof. Thus, both of the substrates 100 and 200 are mechanically united together. Simultaneously, the detection electrode 107 and the connection-side electrode 210b are electrically connected to each other by a conductor portion 140 interposed therebetween.

Moreover, in the AMA substrate 200, a reading drive circuit 260 and a gate drive circuit 270 are provided. As shown in FIG. 7, the reading drive circuit 260 is connected to reading wires (reading address lines) 280 in the longitudinal (Y) direction, which interconnect the drain electrodes of the TFTs 220 belonging to the same columns. Moreover, the gate drive circuit 270 is connected to reading lines (gate address lines) 290 in the lateral (X) direction, which interconnect the gate electrodes of the TFTs 220 belonging to the same row. Note that, though not shown, in the reading drive circuit 260, one preamplifier (charge-voltage converter) is connected to each of the reading wires 280. As described above, the reading drive circuit 260 and the gate drive circuit 270 are connected to the AMA substrate 200. However, one is also used, in which the reading drive circuit 260 and the gate drive circuit 270 are integrally molded in the AMA substrate 200 to achieve integration thereof.

Note that a radiation detection operation by a radiation imaging apparatus in which the above-described radiation detection unit 100 and AMA substrate 200 are joined and united together is described, for example, in Japanese Unexamined Patent Publication No. 11 (1999)-287862 and the like.

Examples of the method according to the present invention for manufacturing the photoconductive layer constituting the radiation imaging panel will be described below.

EXAMPLES

Example 1

$Bi(NO_3)_3$ was dissolved into acetic acid at 40° C., and Si $(O-C_2H_5)_4$ was added thereto by a molar amount equivalent to $1/12$ of that of Bi. To a mixture thus obtained, water equivalent to 50 vol % of the acetic acid was added in order to perform hydrolysis. Subsequently, concentration was performed therefor at 60° C. for two hours under a vacuum condition, and gel $Bi_{12}SiO_{20}$ was obtained. The gel $Bi_{12}SiO_{20}$ thus obtained was fired at 600° C. for an hour in the atmosphere, and crystallized $Bi_{12}SiO_{20}$ was obtained. On an ITO substrate, the crystallized $Bi_{12}SiO_{20}$ was coated by use of polyester resin (Vylon: made by Toyobo Co., Ltd.) of $1/8$ of powder of the $Bi_{12}SiO_{20}$, and a coated film thus obtained was heated and dried at 60° C. for four hours in the atmosphere. Finally, as an upper electrode, Au was sputtered with a thickness of 60 nm on the $Bi_{12}SiO_{20}$ film. In such a way, a radiation imaging panel including a photoconductive layer formed of a $Bi_{12}SiO_{20}$ film was completed.

Example 2

A radiation imaging panel including a photoconductive layer formed of a $Bi_{12}GeO_{20}$ film was completed in a similar procedure to that of Example 1 except that Ge $(O-C_2H_5)_4$ was used in place of $Si(O-C_2H_5)_4$ for use in Example 1.

Example 3

A radiation imaging panel including a photoconductive layer formed of a $Bi_{12}TiO_{20}$ film was completed in a similar procedure to that of Example 1 except that Ti $(O-C_2H_5)_4$ was used in place of $Si(O-C_2H_5)_4$ for use in Example 1.

Comparative Example 1

On an ITO substrate, $Bi_{12}SiO_{20}$ obtained by mixing $Bi_2O_3$ powder and $SiO_2$ powder and firing an obtained mixture at 800° C. was coated by use of polyester resin (Vylon: made by Toyobo Co., Ltd.) of $1/8$ of the $Bi_{12}SiO_{20}$, and a $Bi_{12}SiO_{20}$ film was formed. The film thus coated was heated and dried at 60° C. for four hours in the atmosphere. As an upper electrode, Au was sputtered with a thickness of 60 nm on the $Bi_{12}SiO_{20}$ film. In such a way, a radiation imaging panel including a photoconductive layer formed of a $Bi_{12}SiO_{20}$ film was completed.

Comparative Example 2

A radiation imaging panel including a photoconductive layer formed of a $Bi_{12}GeO_{20}$ film was completed in a similar procedure to that of Comparative example 1 except that $GeO_2$ was used in place of $SiO_2$ for use in Comparative example 1.

Comparative Example 3

A radiation imaging panel including a photoconductive layer formed of a $Bi_{12}TiO_{20}$ film was completed in a similar procedure to that of Comparative example 1 except that $TiO_2$ was used in place of $SiO_2$ for use in Comparative example 1.

Measurement Method and Measurement Result

Each of the radiation imaging panels of Examples 1 to 3 and Comparative examples 1 to 3 was irradiated with a 10 mR X-ray for 0.1 second under a voltage condition of 500V, and a photocurrent as a pulse generated under a condition where a voltage is applied thereto was converted into voltage by a current amplifier, which was then measured by means of a digital oscilloscope. Based on an obtained current/time curve, the voltage was integrated within a range of the X-ray irradiation time, and measured as an amount of generated charges. As a result, the amount of generated charges in each radiation imaging panel of Examples 1 to 3 showed a value three times as high as that in each radiation imaging panel of Comparative examples 1 to 3 in conversion of a film thickness of 200 μm.

As described above, in the first method according to the present invention for manufacturing a photoconductive layer constituting a radiation imaging panel, the bismuth salt and the metal alkoxide are reacted with each other under the acidic condition to obtain the precursor solution of $Bi_{12}MO_{20}$. Subsequently, the obtained precursor solution of $Bi_{12}MO_{20}$ is concentrated to be formed into the gel, and the gel $Bi_{12}MO_{20}$ precursor is fired to be formed into the powder. By use of the powder thus formed, the photoconductive layer is manufactured. Accordingly, in comparison with the case where the photoconductive layer is manufactured by the conventional solid phase method, the particle diameter of the obtained powder can be reduced to the size in the submicron order, thus making it possible to increase the filling factor of $Bi_{12}MO_{20}$ in the photoconductive layer. Accordingly, the collection effect of the generated charges is enhanced, and the electric noise decreases. Therefore, it becomes possible to improve the image granularity.

Moreover, in comparison with the case of manufacturing the photoconductive layer by the conventional sol-gel method, it becomes possible to restrict the manufacturing cost thereof because the bismuth salt is used as a source of the bismuth. In addition, when the bismuth salt and the metal alkoxide are reacted with each other under the acidic condition, it is possible to easily control the concentration of the bismuth ions in the reaction solution by the concentration of the bismuth salt. Accordingly, it is satisfactory if attention is paid only to the hydrolysis rate of the metal alkoxide, and the simple synthesis can be realized.

Subsequently, examples of the second method according to the present invention for manufacturing a photoconductive layer constituting a radiation imaging panel will be described.

Example 4

$Bi(O-iC_3H_7)_3$ of $5 \times 10^{-3}$ mol was dissolved into 2-methoxyethanol, and water of a molar amount equivalent to thirty times that of $Bi(O-iC_3H_7)_3$ and NaOH of $5 \times 10^{-3}$ mol were added thereto. A mixture thus obtained was refluxed at 80° C. for two hours in $N_2$. After the reflux, $Si(O-C_2H_5)_4$ of a molar amount equivalent to $1/12$ of that of Bi was added to the refluxed mixture. A mixture thus obtained was refluxed at 80° C. for two hours and 130° C. for two hours in $N_2$, and was subjected to centrifugal separation, followed by washing by ethanol three times. In such a way, crystallized $Bi_{12}SiO_{20}$ was obtained. On an ITO substrate, the crystallized $Bi_{12}SiO_{20}$ was coated by use of polyester resin (Vylon: made by Toyobo Co., Ltd.) of $1/9$ of powder of $Bi_{12}SiO_{20}$, and a coated film thus obtained was heated and dried at 60° C. for four hours in the atmosphere. Finally, as an upper electrode, Au was sputtered with a thickness of 60 nm on the $Bi_{12}SiO_{20}$ film. In such a way, a radiation imaging panel including a photoconductive layer formed of a $Bi_{12}SiO_{20}$ film was completed.

Example 5

A radiation imaging panel including a photoconductive layer formed of a $Bi_{12}GeO_{20}$ film was completed in a similar procedure to that of Example 4 except that $Ge(O-C_2H_5)_4$ was used in place of $Si(O-C_2H_5)_4$ for use in Example 4.

Example 6

A radiation imaging panel including a photoconductive layer formed of a $Bi_{12}TiO_{20}$ film was completed in a similar procedure to that of Example 4 except that $Ti(O-C_2H_5)_4$ was used in place of $Si(O-C_2H_5)_4$ for use in Example 4.

Comparative example 4

On an ITO substrate, $Bi_{12}SiO_{20}$ obtained by mixing $Bi_2O_3$ powder and $SiO_2$ powder and firing an obtained mixture at 800° C. was coated by use of polyester resin (Vylon: made by Toyobo Co., Ltd.) of $1/9$ of $Bi_{12}SiO_{20}$, and a $Bi_{12}SiO_{20}$ film was formed. The film thus coated was heated and dried at 60° C. for four hours in the atmosphere. As an upper electrode, Au was sputtered with a thickness of 60 nm on the $Bi_{12}SiO_{20}$ film. In such a way, a radiation imaging panel including a photoconductive layer formed of a $Bi_{12}SiO_{20}$ film was completed.

Comparative Example 5

A radiation imaging panel including a photoconductive layer formed of a $Bi_{12}GeO_{20}$ film was completed in a similar procedure to that of Comparative example 4 except that $GeO_2$ was used in place of $SiO_2$ for use in Comparative example 4.

Comparative Example 6

A radiation imaging panel including a photoconductive layer formed of a $Bi_{12}TiO_{20}$ film was completed in a similar procedure to that of Comparative example 4 except that $TiO_2$ was used in place of $SiO_2$ for use in Comparative example 4.

Measurement Method and Measurement Result

Each of the radiation imaging panels of Examples 4 to 6 and Comparative examples 4 to 6 was irradiated with a 10 mR X-ray for 0.1 second under a voltage condition of 500V, and a photocurrent as a pulse generated under a condition where a voltage is applied thereto was converted into voltage by a current amplifier, which was then measured by means of a digital oscilloscope. Based on an obtained current/time curve, the voltage was integrated within a range of the X-ray irradiation time, and measured as an amount of generated charges. As a result, the amount of generated charges in each radiation imaging panel of Examples 4 to 6 showed a value 3.5 times as high as that in each radiation imaging panel of Comparative examples 4 to 6 in conversion of a film thickness of 200 μm.

As described above, in the second method according to the present invention for manufacturing a photoconductive layer constituting a radiation imaging panel, the respective alkoxides of the bismuth and the metal are subjected to the hydrolysis under the alkaline condition, thus making it possible to deposit micro amorphous $Bi_{12}MO_{20}$ particles in the liquid phase. Moreover, the obtained precursor solution of $Bi_{12}MO_{20}$ is crystallized in the liquid phase, and accordingly, the rapid crystal growth is difficult to occur in comparison with the sintering treatment. In comparison with the conventional solid phase method and sol-gel method, it becomes possible to manufacture $Bi_{12}MO_{20}$ particles with a small particle diameter. Accordingly, it becomes possible to increase the filling factor of $Bi_{12}MO_{20}$ in the photoconductive layer, the collection effect of the generated charges is enhanced, and the electric noise decreases. Therefore, it becomes possible to improve the image granularity.

What is claimed is:

1. A method for manufacturing a photoconductive layer constituting a radiation imaging panel which records radiation image information as an electrostatic latent image comprising:

reacting a bismuth salt and metal alkoxide with each other under an acidic condition to obtain a $Bi_{12}MO_{20}$ precursor solution where M is at least one of Ge, Si and Ti, concentrating the $Bi_{12}MO_{20}$ precursor solution into a gel, firing the gel $Bi_{12}MO_{20}$ precursor into powder form, and forming the powder into the photoconductive layer.

2. The method for manufacturing a photoconductive layer constituting a radiation imaging panel according to claim 1, wherein the bismuth salt is either one of bismuth nitrate and bismuth acetate.

3. A method for manufacturing a photoconductive layer constituting a radiation imaging panel which records radiation image information as an electrostatic latent image comprising:

subjecting an alkoxide of bismuth and an alkoxide of a metal selected from the group consisting of Ge, Si, and Ti to hydrolysis under an alkaline condition to obtain a $Bi_{12}MO_{20}$ precursor solution where M is at least one of Ge, Si and Ti used in the hydrolysis, crystallizing $Bi_{12}MO_{20}$ powder from the precursor solution, and forming the powder into the photoconductive layer.

* * * * *